United States Patent
Cheng et al.

(10) Patent No.: US 10,794,759 B2
(45) Date of Patent: Oct. 6, 2020

(54) OPTICAL DETECTION SENSOR

(71) Applicants: FUZHOU BOE OPTOELECTRONICS TECHNOLOGY CO., LTD., Fuzhou, Fujian (CN); BOE TECHNOLOGY GROUP CO., LTD., Beijing (CN)

(72) Inventors: Hao Cheng, Beijing (CN); Yanfei Chi, Beijing (CN); Xi Chen, Beijing (CN); Zhixiao Yao, Beijing (CN); Zongxiang Li, Beijing (CN); Jiamin Liao, Beijing (CN); Wenchang Tao, Beijing (CN); Zhendian Wu, Beijing (CN); Dahai Li, Beijing (CN); Linlin Lin, Beijing (CN); Guichun Hong, Beijing (CN); Yao Liu, Beijing (CN); Zuwen Liu, Beijing (CN); Jin Wang, Beijing (CN); Xinmao Qiu, Beijing (CN); Changhong Shi, Beijing (CN); Yaochao Lv, Beijing (CN); Zihua Zhuang, Beijing (CN); Min Zhou, Beijing (CN); Yawen Huang, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/418,453

(22) Filed: May 21, 2019

(65) Prior Publication Data
US 2020/0011730 A1    Jan. 9, 2020

(30) Foreign Application Priority Data
Jul. 5, 2018   (CN) .......................... 2018 1 0730683

(51) Int. Cl.
*H01L 27/146* (2006.01)
*G01J 1/42* (2006.01)
(Continued)

(52) U.S. Cl.
CPC .......... *G01J 1/42* (2013.01); *H01L 27/14645* (2013.01); *H01L 27/14649* (2013.01);
(Continued)

(58) Field of Classification Search
CPC ......... G01J 1/42; H04N 5/379; H04N 5/3696; H04N 5/33; H01L 27/14645;
(Continued)

(56) References Cited

U.S. PATENT DOCUMENTS

| | | | |
|---|---|---|---|
| 8,564,579 B2 | 10/2013 | Kwon | |
| 2007/0084985 A1* | 4/2007 | Smith | G02B 23/125 250/207 |
| 2015/0286340 A1* | 10/2015 | Send | G01S 5/163 345/175 |

FOREIGN PATENT DOCUMENTS

| | | |
|---|---|---|
| CN | 101256097 A | 9/2008 |
| CN | 103178076 A | 6/2013 |
| CN | 103180968 A | 6/2013 |

OTHER PUBLICATIONS

The First Chinese Office Action dated Aug. 29, 2019; Appln. No. 201810730683.4.

* cited by examiner

*Primary Examiner* — Mekonnen D Dagnew

(57) ABSTRACT

An optical detection sensor is disclosed. The optical detection sensor includes a converter configured to receive non-visible light, convert the non-visible light into visible light, and emit the visible light; and a visible light solid-state image sensor. The converter is located on a light incident side of the visible light solid-state image sensor, and the
(Continued)

visible light solid-state image sensor is configured to receive the visible light to generate an electron flow, convert information of the electron flow into data information, and output the data information.

11 Claims, 3 Drawing Sheets

(51) Int. Cl.
    *H04N 5/369*     (2011.01)
    *H01L 31/105*     (2006.01)

(52) U.S. Cl.
    CPC .. *H01L 27/14689* (2013.01); *H01L 27/14692* (2013.01); *H01L 31/105* (2013.01); *H04N 5/3696* (2013.01); *H04N 5/379* (2018.08)

(58) Field of Classification Search
    CPC ......... H01L 27/14649; H01L 27/14689; H01L 27/14692; H01L 31/105; H01L 27/14643
    See application file for complete search history.

OPTICAL DETECTION SENSOR

The present application claims priority of China Patent application No. 201810730683.4 filed on Jul. 5, 2018, the content of which is incorporated in its entirety as portion of the present application by reference herein.

TECHNICAL FIELD

At least one embodiment of the present disclosure relates to an optical detection sensor.

BACKGROUND

With the development and application of optoelectronic technology, photoelectric conversion sensors with mature technology have been widely applied.

At present, a charge coupled device (CCD) and a complementary metal-oxide-semiconductor (CMOS) sensor are both made of semiconductor materials with high sensitivity, and an optical signal can be converted into an electrical signal by the charge coupled device or the complementary metal-oxide-semiconductor sensor, the electrical signal can be read and applied.

SUMMARY

At least one embodiment of the present disclosure provides an optical detection sensor. The optical detection sensor includes a converter and a visible light solid-state image sensor. The converter is configured to receive non-visible light, convert the non-visible light into visible light, and emit the visible light; and the converter is located on a light incident side of the visible light solid-state image sensor, and the visible light solid-state image sensor is configured to receive the visible light to generate an electron flow, convert information of the electron flow into data information, and output the data information.

For example, the visible light solid-state image sensor includes a photodiode, a thin film transistor, and a read out integrated circuit. The converter is located on a light incident side of the photodiode, and the photodiode is configured to absorb the visible light emitted by the converter and generate the electron flow; the thin film transistor is connected with the photodiode and configured to receive the electron flow in the photodiode; and the read out integrated circuit is connected with the thin film transistor and configured to read the information of the electron flow from the thin film transistor, convert the information of the electron flow into the data information, and output the data information.

For example, the converter includes an organic light emitting layer, an anode, and a cathode; the anode and the cathode are respectively located on both sides of the organic light emitting layer, the anode is configured to absorb photons of the non-visible light and generate photo-generated carriers injected into the organic light emitting layer.

For example, the anode includes a heterojunction photo transistor including an emitter, a base and a collector which are sequentially stacked, the collector is located on a side of the base and the emitter close to the photodiode, and the collector is configured to inject the photo-generated carriers into the organic light emitting layer, so that the organic light emitting layer emits the visible light.

For example, the anode further includes a metal electrode layer on a side of the heterojunction photo transistor facing the organic light emitting layer.

For example, the emitter of the heterojunction photo transistor includes p-type indium phosphide, the base includes n-type indium gallium arsenide, and the collector includes p-type indium gallium arsenide.

For example, the visible light solid-state image sensor includes a charge coupled device or a complementary metal-oxide-semiconductor image sensor.

For example, the photodiode is a PIN photodiode.

For example, the visible light solid-state image sensor further includes a control line and a data line, the control line is connected with a gate electrode of the thin film transistor to turn on/off the thin film transistor, the data line is connected with one of a source electrode and a drain electrode of the thin film transistor to receive the electron flow of the photodiode, and the other one of the source electrode and the drain electrode of the thin film transistor is connected with the photodiode.

For example, the read out integrated circuit includes an analog-to-digital converter, and the read out integrated circuit is configured to read a charge change amount on the data line, convert the charge change amount into a low voltage differential signal by the analog-to-digital converter, and output the low voltage differential signal.

For example, the non-visible light received by the converter includes infrared light.

For example, the visible light converted by the converter includes green light.

For example, the visible light solid-state image sensor further includes a light shielding layer located on a side of the thin film transistor facing the converter to prevent the visible light from irradiating the thin film transistor.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1A:
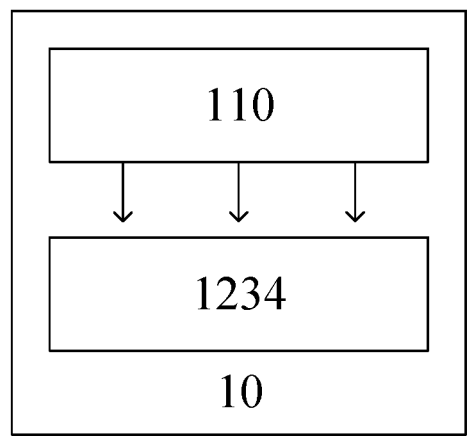
FIG. 1A is a schematic structural diagram of an optical detection sensor provided by an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

In the research, the inventor(s) of the present application notices that infrared light of which wavelength is located between that of visible light and microwave has a great application prospect in military industry, medical industry and photovoltaic industry. However, it is difficult for the existing CCD, CMOS and other sensors to capture light with a wavelength greater than 1 micron (μm) in infrared waveband. Thus, an application range of such sensors is limited.

An optical detection sensor provided by an embodiment of the present disclosure includes a converter and a visible light solid-state image sensor. The converter is located on a light incident side of the visible light solid-state image sensor, and the visible light solid-state image sensor is configured to receive visible light to generate an electron flow, convert information of the electron flow into data information, and output the data information. In the optical detection sensor provided by the embodiment of the present disclosure, the converter is combined with the visible light solid-state image sensor, and non-visible light received by the converter serving as a non-visible light conversion device is converted into visible light, and the visible light solid-state image sensor converts the visible light obtained from the converter into a digital signal and outputs the digital signal, thus achieving a function of converting non-visible light having infrared waveband, near infrared waveband and other wavebands into a digital signal. Therefore, a problem that an application range of CCD, CMOS and other sensors is limited due to the difficulty in capturing light with a wavelength greater than 1 μm in the infrared waveband can be solved, so that the optical detection sensor provided by the embodiment of the present disclosure can be widely applied in industries such as military industry, medical industry and photovoltaic industry.

Hereinafter, the optical detection sensor provided by at least one embodiment of the present disclosure will be described below with reference to the accompanying drawings.

FIG. 1A is a schematic structural diagram of an optical detection sensor provided by at least one embodiment of the present disclosure. The optical detection sensor 10 provided in the present embodiment may include a converter 110 and a visible light solid-state image sensor 1234. The converter 110 is located on a light incident side of the visible light solid-state image sensor 1234, and the visible light solid-state image sensor 1234 is configured to receive visible light to generate an electron flow, convert information of the electron flow into data information, and output the data information. According to the embodiment of the present disclosure, by combining the converter serving as a non-visible light conversion device with the visible light solid-state image sensor, a problem that an application range of CCD, CMOS and other sensors is limited due to the difficulty in capturing light with a wavelength greater than 1 μm in the infrared waveband can be solved, so that the optical detection sensor provided by at least one embodiment of the present disclosure can be widely applied to industries such as military industry, medical industry, and photovoltaic industry.

For example, the visible light solid-state image sensor 1234 may include a charge coupled device or a complementary metal-oxide-semiconductor image sensor.

Figure 1B:
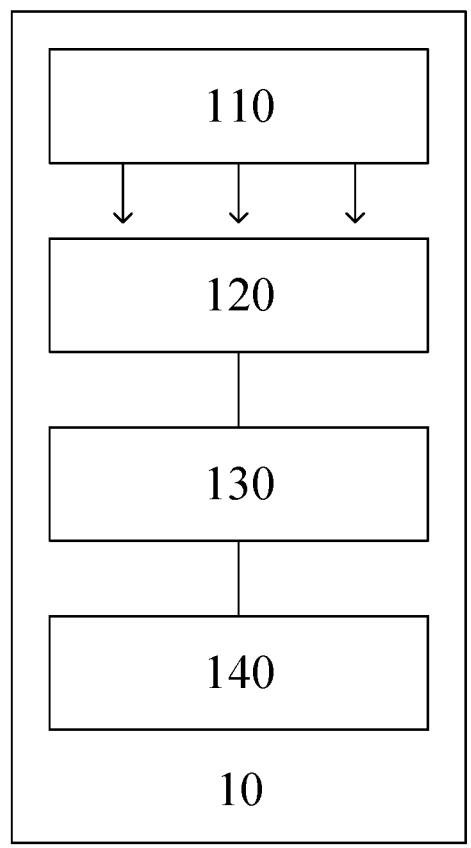
FIG. 1B is a schematic structural diagram of an optical detection sensor provided by an embodiment of the present disclosure.

For example, as illustrated by FIG. 1B, the visible light solid-state image sensor 1234 may include a photodiode 120, a thin film transistor (TFT) 130, and a read out integrated circuit (ROIC) 140.

In at least one embodiment of the present disclosure, the converter 110 can emit the visible light converted by the converter 110, the visible light can be received by the photodiode 120, and an internal of the photodiode 120 excites electrons after absorbing the visible light. For example, the photodiode 120 may include a P layer and an N layer, and electrons generated by excitation cannot pass through the P layer, that is, electrons flow out from the N layer of the photodiode 120 to form an electron flow out from the photodiode 120. After the electron flow of the photodiode 120 reaches the thin film transistor 130, the read out integrated circuit 140 connected with the thin film transistor 130 reads the information of the electron flow from the thin film transistor 130, converts a signal of the electron flow as read into a digital signal, and outputs the digital signal, thus achieving an indirect detection sensor configured to detect non-visible light.

The optical detection sensor provided by at least one embodiment of the present disclosure combines modules such as a converter, a photodiode, a thin film transistor, and a read out integrated circuit. The converter serves as a non-visible light conversion device to convert non-visible light as received into visible light, the photodiode generates an electron flow after absorbing the visible light obtained from the converter, and after the electron flow reaches the thin film transistor, the read out integrated circuit reads the electron flow in the thin film transistor, converts information of the electron flow as read into digital information, and outputs the digital information. According to the optical detection sensor provided by the embodiment of the present disclosure, a function of converting non-visible light having infrared waveband, near infrared waveband and other wavebands into a digital signal can be realized by reasonably configuring the abovementioned combination mode, so that the optical detection sensor can be widely configured into industries such as military industry, medical industry, and photovoltaic industry, and the problem that the application range of common CCD, CMOS and other sensors is limited due to the difficulty in capturing light with a wavelength greater than 1 μm in the infrared waveband can be solved.

For example, as illustrated by FIG. 1B, the converter 110 is located on a light incident side of the photodiode 120, and the photodiode 120 is configured to absorb the visible light emitted by the converter 110 (arrows in FIG. 1 indicate the visible light emitted by the converter) and generate an electron flow, which is a current formed by directional movement of free electrons in space. The thin film transistor 130 is connected with the photodiode 120 and configured to receive the electron flow in the photodiode 120. The read out integrated circuit 140 is connected with the thin film transistor 130, and is configured to read information of the electron flow from the thin film transistor 130, convert the information of the electron flow as read into data information, and output the data information.

For example, the converter 110 may include a photosensitive material to receive non-visible light, such as infrared light and near infrared light, and may convert the non-visible light as received into visible light and emit the visible light, so that the photodiode 120 located on a light exit side of the converter 110 can receive visible light.

For example, in practical application, the non-visible light absorbed by the converter 110 may be infrared light that is harmless to human body, including, for example, near infrared light, middle infrared light, and far infrared light. The following embodiments of the present disclosure will be described by taking a case where the converter 110 absorbs near infrared light as an example. The converter 110 can convert the near infrared light absorbed by the converter 110 into green light with a wavelength of about 520 nanometers (nm), but the embodiments of the present disclosure are not limited thereto.

Figure 2:
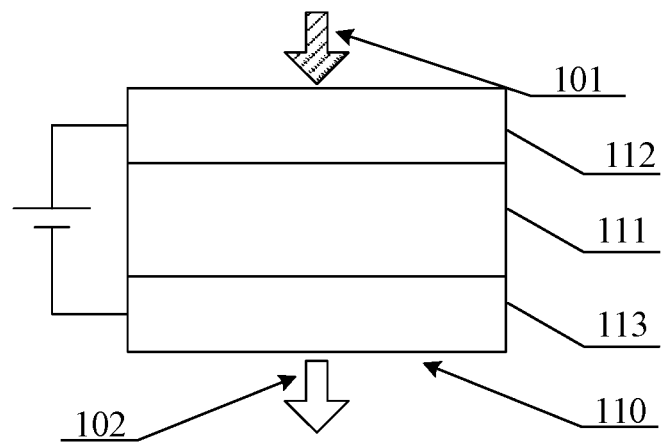
FIG. 2 is a schematic structural diagram of a converter in an optical detection sensor provided by an embodiment of the present disclosure.

For example, FIG. 2 is a schematic structural diagram of a converter in an optical detection sensor provided by an example of at least one embodiment of the present disclosure. As illustrated by FIG. 2, the converter 110 provided by the embodiment of the present disclosure may include an organic light emitting layer 111, an anode 112, and a cathode 113, the anode 112 and the cathode 113 are located on both sides of the organic light emitting layer 111.

For example, the organic light emitting layer 111 may include a light emitting layer, a hole transport layer located on a side of the light emitting layer close to the anode 112, and an electron transport layer located on a side of the light emitting layer close to the cathode 113. The anode, the organic light emitting layer, and the cathode constitute an organic light emitting diode.

For example, as illustrated by FIG. 2, near infrared light may be received by the anode 112 to generate photo-generated carriers. For example, a voltage of, for example, a bias voltage of 12 volts (V) may be applied to the anode 112 and the cathode 113 located on both sides of the organic light emitting layer 111. Under the action of electric field, the anode 112 generates holes by receiving the near-infrared light 101, and the cathode 113 generates electrons. The holes injected into the organic light emitting layer 111 by the anode 112 are combined with the electrons injected into the organic light emitting layer 111 by the cathode 113 in the light emitting layer of the organic light emitting layer 111, thereby emitting visible light 102, for example, the visible light 102 may be green light with a wavelength of about 520 nm.

Figure 3:
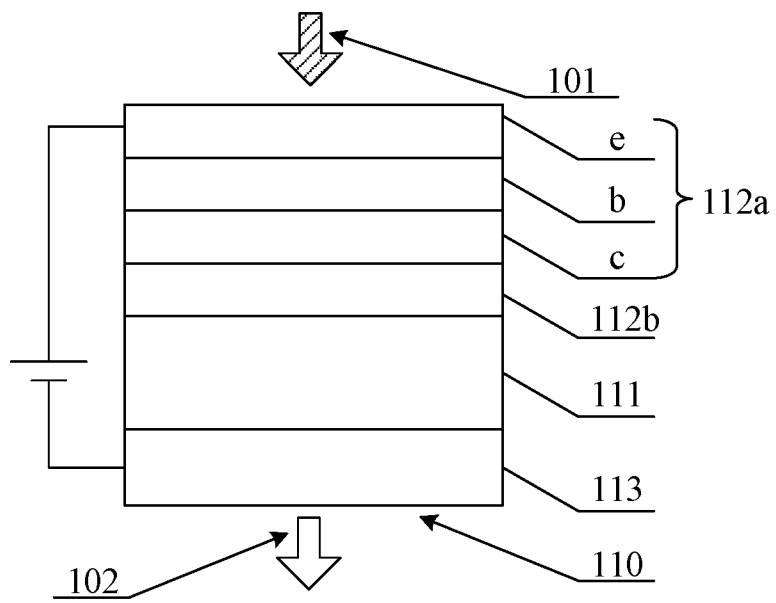
FIG. 3 is a schematic structural diagram of another converter in an optical detection sensor provided by an embodiment of the present disclosure.

For example, FIG. 3 is a schematic structural diagram of a converter in an optical detection sensor provided by another example of at least one embodiment of the present disclosure. As illustrated by FIG. 3, the anode 112 of the converter 110 in the embodiment of the present disclosure may include a heterojunction photo transistor (HPT) 112a and a metal electrode layer 112b. The heterojunction photo transistor 112a may include an emitter e, a base b and a collector c which are sequentially connected, i.e., the emitter e, the base b and the collector c are sequentially stacked. The collector c is located on a side of the base b and the emitter a close to the photodiode, and the collector c is configured to inject photo-generated carriers into the organic light emitting layer 111 so that the organic light emitting layer 111 emits the visible light 102.

For example, the heterojunction photo transistor 112a has an internal gain and can achieve an amplification of photocurrent. The base b of the heterojunction photo transistor 112a absorbs photons of the near-infrared light 101 to generate photo-generated carriers. Under the action of an applied voltage, a base-emitter junction is forward biased and a base-collector junction is reverse biased. The heterojunction photo transistor 112a operates in an amplification region, and photocurrent as generated is amplified, outputted at the collector c of the heterojunction photo transistor 112a, and injected into the organic light emitting layer 111.

For example, the base b and the collector c in the heterojunction photo transistor 112a absorb non-visible light to generate electron-hole pairs, electrons are accumulated in the base b, so that a forward voltage between the base b and the emitter e is increased, and a reverse voltage between the base b and the collector c is increased, thereby injecting holes into the organic light emitting diode 111. Therefore, the heterojunction photo transistor in the embodiment of the present disclosure functions as an anode of the organic light emitting diode.

For example, as illustrated by FIG. 3, the emitter e of the heterojunction photo transistor 112a may be p-type indium phosphide (P-InP), the base b may be n-type indium gallium arsenide (N-InGaAs), and the collector c may be p-type indium gallium arsenide (P-InGaAs). The embodiment of the present disclosure will be described by taking a case where the heterojunction photo transistor 112a is a PNP type heterojunction photo transistor 112a as an example.

For example, in a manufacturing process of the heterojunction photo transistor 112a, the abovementioned PNP-type heterojunction photo transistor 112a can be formed by using P-InP as a substrate and epitaxially growing P-InGaAs and N-InGaAs. The P-InP, the N-InGaAs, the P-InGaAs and the organic light emitting layer which are connected in series form a main structure of the heterojunction photo transistor 112a in the embodiment of the present disclosure. In the main structure, the base b (N-InGaAs) and the collector c (P-InGaAs) generate carriers after absorbing near infrared light. Under the action of an applied voltage (for example, 12V), electrons are accumulated at the base b (N-InGaAs), so that a forward voltage between the base b (N-InGaAs) and the emitter e (P-InP) is increased, and a reverse voltage between the base b (N-InGaAs) and the collector c (P-InGaAs) is increased (i.e., the base-emitter junction of the heterojunction photo transistor 112a is forward biased and the base-collector junction is reverse biased), resulting in an effect of current gain. The heterojunction photo transistor 112a operates in an amplification region, and photocurrent as generated is amplified and outputted at the collector c, and holes are injected into the organic light emitting diode 111. The PNP type heterojunction photo transistor 112a is mainly configured to absorb near infrared light with a wavelength range of 0.7 to 2.5 μm.

It should be noted that the structure of the heterojunction photo transistor 112a is used as the anode 112 of the organic light emitting diode, and a metal electrode layer 112b is further arranged between the organic light emitting layer 111 and the anode 112 of the organic light emitting diode. The metal electrode layer 112b is favorable for carrier transmission and reduces a turn-on voltage of the heterojunction photo transistor 112a.

Figure 4:
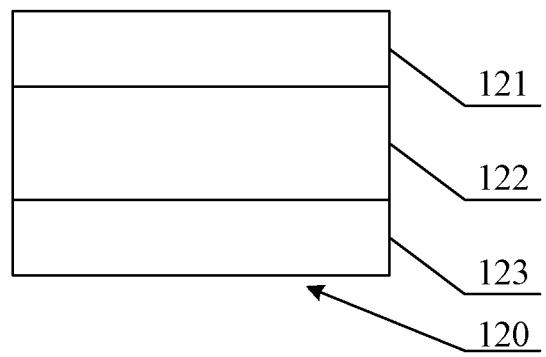
FIG. 4 is a schematic structural diagram of a photodiode in an optical detection sensor provided by an embodiment of the present disclosure.

For example, FIG. 4 is a schematic structural diagram of a photodiode in an optical detection sensor according to an embodiment of the present disclosure. The photodiode 120 in the embodiment of the present disclosure may adopt a PIN photodiode 120, which may include a P layer 121, an I layer 122, and an N layer 123 which are sequentially stacked. Herein, the I layer 122 is an intrinsic semiconductor layer or a doped layer of an intrinsic semiconductor with a low doping concentration. The I layer 122 is relatively thick and occupies almost an entire depletion layer, so most of the light incident through the transparent electrode 130 of the photodiode 120 is absorbed in the I layer 122 and generates a large number of electron-hole pairs.

For example, after the PIN photodiode 120 is configured to absorb non-visible light, the I layer 122 excites electrons, and the electrons flow out of the N layer 123 to form an electron flow.

In the embodiment of the present disclosure, visible light (e.g., green light) generated by the converter 110 is absorbed by the PIN photodiode 120, and the I layer 122 generates photo-excited electrons. Because the electrons cannot pass through the P layer 121, i.e., the electrons flow out of the N layer 123 to form the electron flow.

Figure 5:
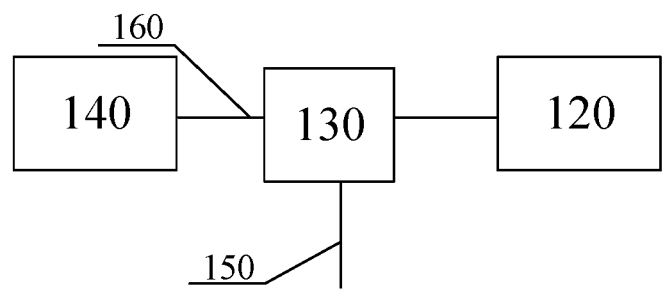
FIG. 5 is a schematic diagram of a connection relationship among a photodiode, a thin film transistor, and a read out integrated circuit in an embodiment of the present disclosure.

For example, FIG. 5 is a schematic diagram of a connection relationship among a photodiode, a thin film transistor, and a read out integrated circuit in an embodiment of the present disclosure. As illustrated by FIG. 5, the visible light solid-state image sensor further includes a control line 150 and a date line 160. The control line 150 is connected with a gate electrode of the thin film transistor 130 to turn on/off the thin film transistor 130, the data line 160 is connected with one of a source electrode and a drain electrode of the thin film transistor 130 to receive the electron flow flowing out of the photodiode 120, and the other one of the source electrode and the drain electrode of the thin film transistor 130 is connected with the photodiode 120.

For example, as illustrated by FIG. 5, a control circuit can control the turn-on and turn-off of the thin film transistor 130 through the control line 150. Therefore, implementation of the thin film transistor 130 receiving the electron flow flowing out of the photodiode 120 can include: after the thin film transistor 130 is turned on through the control line 150, the data line 160 receives the electron flow flowing out of the photodiode 120, so that charge amount of the data line 160 changes.

For example, the embodiment of the present disclosure is described by taking a case where the photodiode 120 is a PIN photodiode as an example. After the thin film transistor 130 is turned on, electrons flowing out of the N layer of the PIN photodiode can pass through the thin film transistor 130 and flow into the data line 160. Thus, an amount of charge in the data line 160 changes.

For example, in the embodiment of the present disclosure, the read out integrated circuit 140 may include an analog-to-digital converter (ADC). Implementation of the read out integrated circuit 140 reading the electron flow from the thin film transistor 130, converting information of the electron flow as read into data information, and then outputting the data information may include: the read out integrated circuit 140 reads a charge change amount of the data line 160, converts the charge change amount through the analog-to-digital converter into a low voltage differential signal (LVDS), and outputs the low voltage differential signal. The low voltage differential signal is a small amplitude differential signal, which can reduce a power supply voltage and a logic voltage swing to effectively improve data transmission speed.

Figure 6:
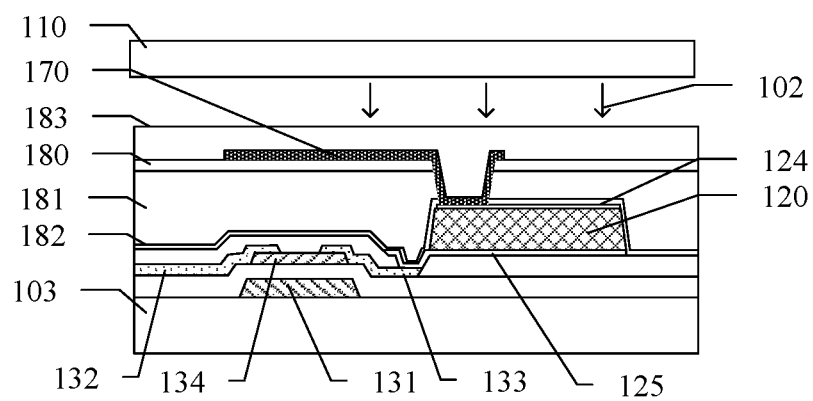
FIG. 6 is a schematic structural diagram of another optical detection sensor provided by an embodiment of the present disclosure.

FIG. 6 is a schematic structural diagram of an optical detection sensor according to an embodiment of the present disclosure. FIG. 6 schematically shows a cross-sectional view of the converter 110, the PIN photodiode 120 and the thin film transistor 130. As illustrated by FIG. 6, the PIN photodiode 120 and the thin film transistor 130 are disposed on a base substrate 103, the thin film transistor 130 includes a gate electrode 131, a source electrode 132 and a drain electrode 133, and a portion of the source electrode 132 and a portion of the drain electrode 133 are located on the active layer 134. The PIN photodiode 120 is connected with the drain electrode 133 of the thin film transistor 130 through a bottom electrode 125 connected with the N layer of the PIN photodiode 120, and is configured to transfer electron flow flowing out of the N layer to the data line connected with the source electrode 132 of the thin film transistor 130 through the thin film transistor 130. A top electrode 124 is provided on a side of the P layer of the PIN photodiode 120 away from the I layer of the PIN photodiode 120. For example, the top electrode 124 may be an indium tin oxide (ITO) electrode.

For example, as illustrated by FIG. 6, in the structure of the optical detection sensor, a conventional insulating layer is also provided on a side of the thin film transistor 130 close to the converter 110, the insulating layer may include, for example, a passivation layer 180 and a resin layer 181. A buffer layer 182 is provided on a side of the thin film transistor 130 and the PIN photodiode 120 close to the converter 110, and the buffer layer 182 is configured to improve adhesion of the entire structure.

For example, as illustrated by FIG. 6, the optical detection sensor provided by the embodiment of the present disclosure is a detection sensor with a flat panel structure, which adopts the converter 110, the photodiode 120, the thin film transistor 130 and the read out integrated circuit structure to achieve converting non-visible light into a digital signal and then outputting the digital signal. The detection sensor with a flat panel structure has a simple structure and is easy to implement, and the flat panel structure only occupies a relatively small physical space to achieve a detection of the non-visible light and a signal conversion function.

For example, in the embodiment of the present disclosure, because the converter 110 converts non-visible light into visible light, the visible light as converted is scattered light, i.e., the visible light as converted has no fixed incident direction, and the visible light outside a coverage area of the PIN photodiode 120 has no practical effect. If the visible light irradiates on the thin film transistor 130, the characteristics of the thin film transistor 130 will be affected. Therefore, a light shielding layer 170 may be provided on a side of the thin film transistor 130 facing the converter 110 and in an area other than a portion of the photodiode 120 for receiving the visible light, for example, the light shielding layer 170 may be a shielding metal layer to shield invalid light irradiated on the thin film transistor 130.

For example, as illustrated by FIG. 6, the optical detection sensor further includes a bias signal line 170 located on a side of the photodiode 124 facing the converter 110, and the bias signal line 170 is electrically connected with a top electrode 124 on a side of the photodiode 120 close to the converter 110 to provide an applied electric field to electrons and holes in the photodiode 120. The embodiment of the present disclosure is described by taking a case where the light shielding layer is a part of the bias signal line as an example, but is not limited thereto, and the light shielding layer and the bias signal line may also be separated structures.

Although the disclosed embodiments of the present disclosure have been described above, the above description is only embodiments for facilitating understanding of the present disclosure and is not intended to limit the present disclosure. Any person skilled in the art to which this disclosure belongs may make any modifications and changes in the form and details of implementations without departing from the spirit and scope of this disclosure, but the scope of patent protection of the present disclosure should still be subject to the scope defined by the appended claims.

The following points should be noted:

(1) The accompanying drawings in the embodiments of the present disclosure only involve structures relevant to the embodiments of the present disclosure, and other structures may refer to the prior art.

(2) The features in the same embodiment or different embodiments of the present disclosure can be mutually combined without conflict.

The foregoing is only the embodiments of the present disclosure and not intended to limit the scope of protection of the present disclosure, and the protection scope of the present disclosure should be based on the protection scope of the appended claims.

What is claimed is:

1. An optical detection sensor, comprising:
   a converter configured to receive non-visible light, convert the non-visible light into visible light, and emit the visible light; and
   a visible light solid-state image sensor,
   wherein the converter is located on a light incident side of the visible light solid-state image sensor, and the visible light solid-state image sensor is configured to receive the visible light to generate an electron flow, convert information of the electron flow into data information, and output the data information,
   the converter comprises an organic light emitting layer, an anode, and a cathode; the anode and the cathode are respectively located on both sides of the organic light emitting layer, the anode is configured to absorb photons of the non-visible light and generate photo-generated carriers injected into the organic light emitting layer, and
   the anode comprises a heterojunction photo transistor including an emitter, a base and a collector which are sequentially stacked, the collector is located on a side of the base and the emitter close to the photodiode, and the collector is configured to inject the photo-generated carriers into the organic light emitting layer, so that the organic light emitting layer emits the visible light.

2. The optical detection sensor according to claim 1, wherein the visible light solid-state image sensor comprises a photodiode, a thin film transistor, and a read out integrated circuit;
   the converter is located on a light incident side of the photodiode, and the photodiode is configured to absorb the visible light emitted by the converter and generate the electron flow;
   the thin film transistor is connected with the photodiode and configured to receive the electron flow in the photodiode; and
   the read out integrated circuit is connected with the thin film transistor and configured to read the information of the electron flow from the thin film transistor, convert the information of the electron flow into the data information, and output the data information.

3. The optical detection sensor according to claim 2, wherein the photodiode is a PIN photodiode.

4. The optical detection sensor according to claim 2, wherein the visible light solid-state image sensor further comprises a control line and a data line, the control line is connected with a gate electrode of the thin film transistor to turn on/off the thin film transistor, the data line is connected with one of a source electrode and a drain electrode of the thin film transistor to receive the electron flow of the photodiode, and the other one of the source electrode and the drain electrode of the thin film transistor is connected with the photodiode.

5. The optical detection sensor according to claim 4, wherein the read out integrated circuit comprises an analog-to-digital converter, and the read out integrated circuit is configured to read a charge change amount on the data line, convert the charge change amount into a low voltage differential signal by the analog-to-digital converter, and output the low voltage differential signal.

6. The optical detection sensor according to claim 2, wherein the visible light solid-state image sensor further comprises a light shielding layer located on a side of the thin film transistor facing the converter to prevent the visible light from irradiating the thin film transistor.

7. The optical detection sensor according to claim 1, wherein the anode further comprises a metal electrode layer on a side of the heterojunction photo transistor facing the organic light emitting layer.

8. The optical detection sensor according to claim 1, wherein the emitter of the heterojunction photo transistor comprises p-type indium phosphide, the base of the heterojunction photo transistor comprises n-type indium gallium arsenide, and the collector of the heterojunction photo transistor comprises p-type indium gallium arsenide.

9. The optical detection sensor according to claim 1, wherein the visible light solid-state image sensor comprises a charge coupled device or a complementary metal-oxide-semiconductor image sensor.

10. The optical detection sensor according to claim 1, wherein the non-visible light received by the converter comprises infrared light.

11. The optical detection sensor according to claim 1, wherein the visible light converted by the converter comprises green light.

* * * * *